(12) United States Patent
Lo

(10) Patent No.: US 6,341,065 B1
(45) Date of Patent: Jan. 22, 2002

(54) HEAT SINK CLIP

(75) Inventor: Wei-Ta Lo, Miou-Li (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/679,594

(22) Filed: Oct. 4, 2000

(30) Foreign Application Priority Data

Jun. 9, 2000 (TW) .......................................... 089209809

(51) Int. Cl.[7] ................................................ H05K 7/20
(52) U.S. Cl. ...................... 361/704; 24/458; 165/185; 248/510; 257/727
(58) Field of Search ............................... 24/570, 573.1, 24/473, 625, 453, 457, 458; 248/316.7, 500, 505, 510; 267/150, 158, 160; 165/185, 80.3; 174/16.3; 439/485, 487; 257/717–719, 727; 361/687, 703, 704, 722, 717–719, 709–711

(56) References Cited

U.S. PATENT DOCUMENTS 5,660,562 A * 8/1997 Lin ............................. 439/487
6,181,559 B1 * 1/2001 Seo ............................. 361/704
6,222,734 B1 * 4/2001 Bookhardt et al. .......... 361/719
6,229,705 B1 * 5/2001 Lee ............................. 361/704
6,243,265 B1 * 6/2001 Wong et al. ................. 361/704

* cited by examiner

Primary Examiner—Gerald Tolin
(74) Attorney, Agent, or Firm—Wei Te Chung

(57) ABSTRACT

A heat sink clip (10) includes a body (12) and a fastener (14). The body includes a spring portion (20) positioned above a heat sink, and two legs (28) extending from opposite ends of the spring portion. Each leg defines an aperture (30) for engaging a catch of a retention module mounted beside an electronic device. The spring portion has a horizontal section (26) which forms a spring tongue (21). A pair of L-shaped guiding tabs (22) is formed under and spaced from the horizontal section, with a space defined between the horizontal section and the guiding tabs. A gap (24) is formed between the guiding tabs. The fastener includes an operation portion (40), and a connecting portion (42) for insertion in the space between the horizontal section and the guiding tabs. The connecting portion defines a slot (43) for engagement with the spring tongue of the body. A spring tab (46) is formed under the connecting portion. The spring tab elastically deforms, thereby exerting a spring force between the heat sink and the clip, and thus securely attaching the heat sink to the electronic device.

7 Claims, 4 Drawing Sheets

HEAT SINK CLIP

BACKGROUND

1. Field of the Invention

The present invention relates to a clip, and particularly to a clip for a heat sink which readily attaches the heat sink to an electronic device.

2. The Related Art

Typical heat sinks are mounted to an outer surface of an electronic package, such as a central processing unit (CPU), to facilitate heat dissipation. Most heat sinks are thermally conductive, and have a plurality of fins to provide a large surface area which allows heat to be more efficiently dissipated by natural or forced convection. Heat sinks are mounted to electronic packages in a variety of ways, such as by a clip.

Referring to FIG. 1, a conventional clip 110 comprises a pressing body 114 and first and second arms 112, 118 extending from opposite ends of the pressing body 114. Each arm defines an aperture (not labeled) for engaging with a catch (not shown) formed on a socket on which a CPU is mounted. An operation section 116 is stamped on the second arm 118, and extends in an opposite direction with respect to the second arm 118. The operation section 116 is further bent to form a handle 119.

In assembly, the aperture of the first arm 112 is first engaged with the corresponding catch. Then the handle 119 of the operation section 116 is depressed to cause the aperture of the second arm 118 to engage with the other catch, whereupon the pressing body 114 generates a spring force for pushing the heat sink onto the CPU. To remove the clip, the handle 119 is depressed, and the second arm 118 or the bottom portion of the operation section 116 is forced outward to disengage the aperture of the second arm 118 from the corresponding catch. However, this disassembly procedure is unnecessarily cumbersome and complicated.

Referring to FIG. 2, another conventional clip 120 comprises a first member 130 and a second member 140 coupled to the first member 130. The first member 130 comprises a first arm 132, a pressing portion 134 and a connecting portion 136. The connecting portion 136 is barb-shaped for connecting with the second member 140. The second member 140 comprises a second arm 142 defining a connecting aperture 144 for engaging the connecting portion 136, and an operation portion 146. However, the connecting portion 136 is easily broken away from the connecting aperture 144 when acted upon by an external force.

Related patents are disclosed in Taiwan Patent Applications Nos. 85211135 and 85214941, and U.S. Pat. Nos. 5,602,719 and 5,600,540.

SUMMARY OF THE INVENTION

Accordingly, an object of the present invention is to provide a clip) for a heat sink which readily attaches/detaches the heat sink to/from an electronic device.

Another object of the present invention is to provide a clip for securely attaching a heat sink to an electronic device.

To achieve the above-mentioned objects, a heat sink clip comprises a body and a fastener. The body comprises a spring portion positioned above a heat sink, and two legs extending from opposite ends of the spring portion. Each leg defines an aperture for engaging a catch of a retention module positioned beside an electronic device. The spring portion has a horizontal section which forms a spring tongue. A pair of L-shaped guiding tabs is formed under and spaced from the horizontal section, thereby defining a space between the horizontal section and the guiding tabs. A gap is formed between the guiding tabs. The fastener includes an operation portion, and a connecting portion for insertion in the space between the horizontal section and the guiding tabs. The connecting portion defines a slot for engagement with the spring tongue of the body. A spring tab is formed under the connecting portion. When the spring tab is elastically deformed, it exerts a spring force between the heat sink and the clip, thereby securely attaching the heat sink to the electronic device.

Other objects, advantages and novel features of the present invention will be drawn from the following detailed embodiment of the present invention with attached drawings, in which:

DESCRIPTION OF THE PREFERRED EMBODIMENT

Figure 1:
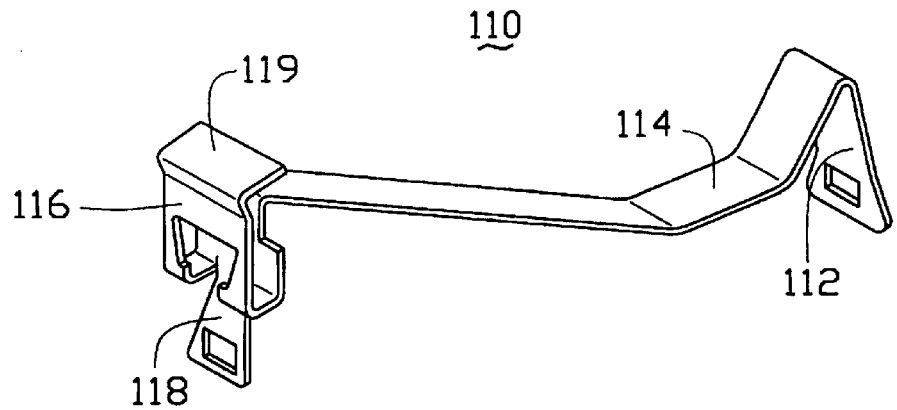
FIG. 1 is a perspective view showing a conventional clip.
Figure 2:
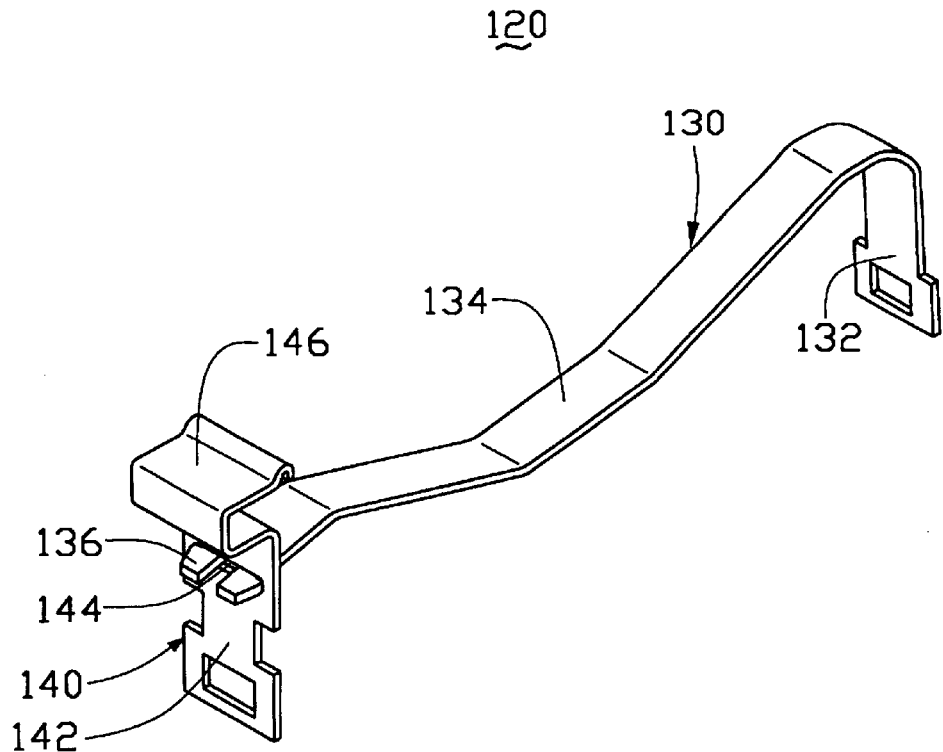
FIG. 2 is a perspective view showing another conventional clip.
Figure 3:
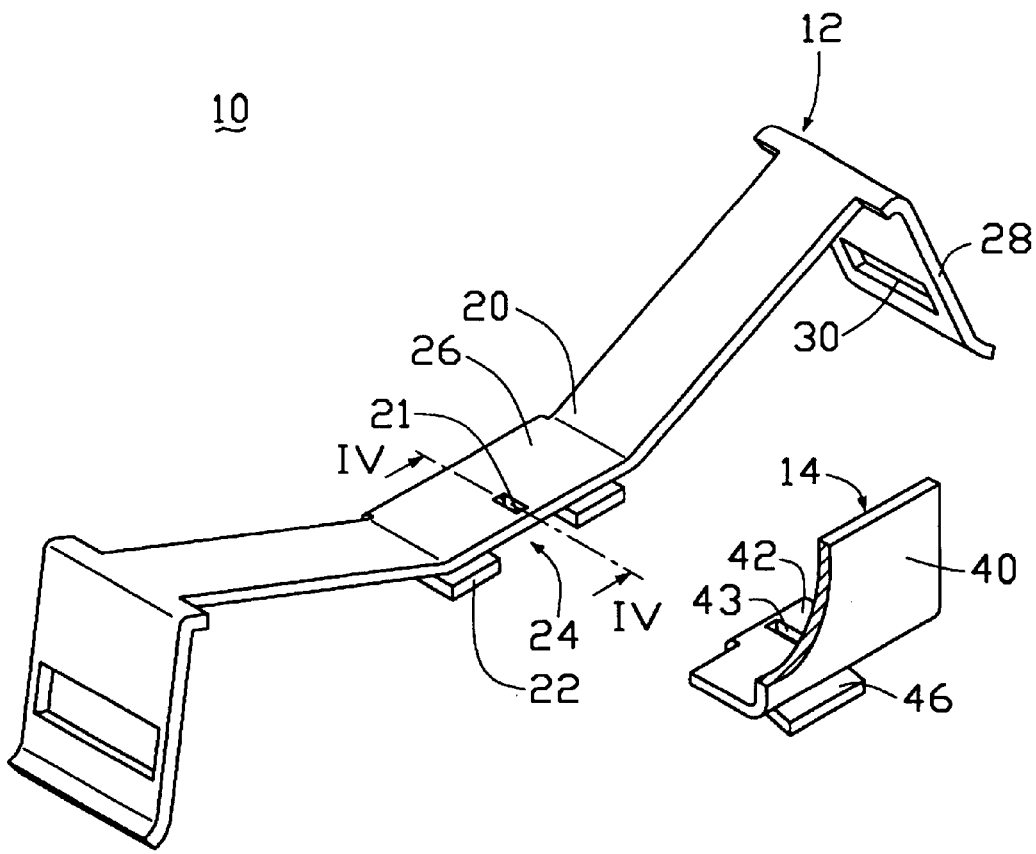
FIG. 3 is an exploded perspective view showing a clip of the present invention.
Figure 4:
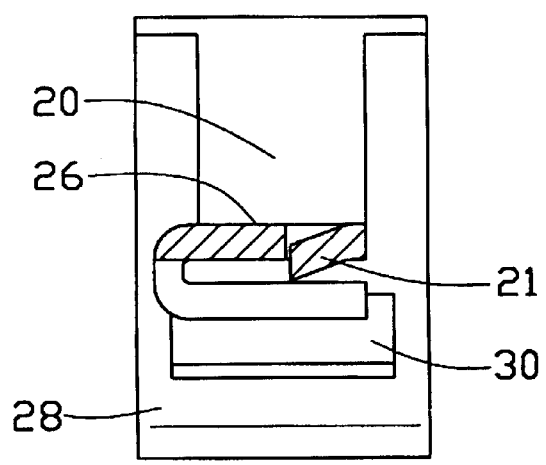
FIG. 4 is a cross-sectional view of the clip in FIG. 3, taken along line IV—IV.

Referring to FIGS. 3 and 4, a heat sink clip 10 of the present invention includes a body 12 and a fastener 14. The body 12 includes a spring portion 20 and two legs 28 extending downward from opposite ends of the spring portion 20. Each leg 28 defines an aperture 30 for receiving a corresponding catch 62 formed on a retention module 60 (see FIG. 5). The spring portion 20 has a horizontal section 26 which is stamped to form a spring tongue 21 extending downward from the spring portion 20. A pair of L-shaped guiding tabs 22 extends from one edge of the horizontal section 26 and opposite an underside of the horizontal section 26. A narrow space (not labeled) is thereby defined between the horizontal section 26 and the guiding tabs 22. The guiding tabs 22 are spaced from each other and thus define a gap 24 therebetween. The spring tongue 21 is located between the guiding tabs 22.

The fastener 14 includes an operation portion 40, and a connecting portion 42 for being received in the space between the horizontal section 26 and the guiding tabs 22. The connecting portion 42 defines a slot 43 for engagement with the spring tongue 21 of the body 12. A spring tab 46 extends slightly downward from an edge of the connecting portion 42 opposite the operation portion 40. The spring tab 46 is formed under and confronts the connecting portion 42. The width of the spring tab 46 is slightly less than that of the gap 24, for being engagingly received therein.

Figure 5:
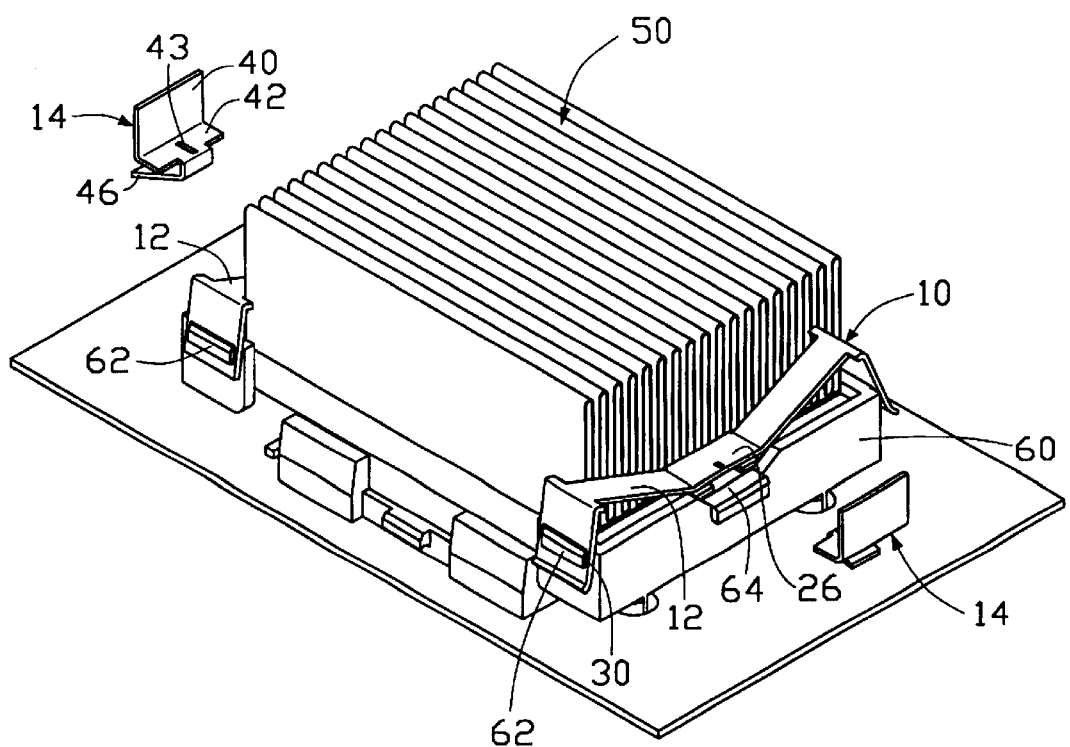
FIG. 5 is an exploded view showing a pair of clips of the present invention attaching a heat sink to an electronic device.
Figure 6:
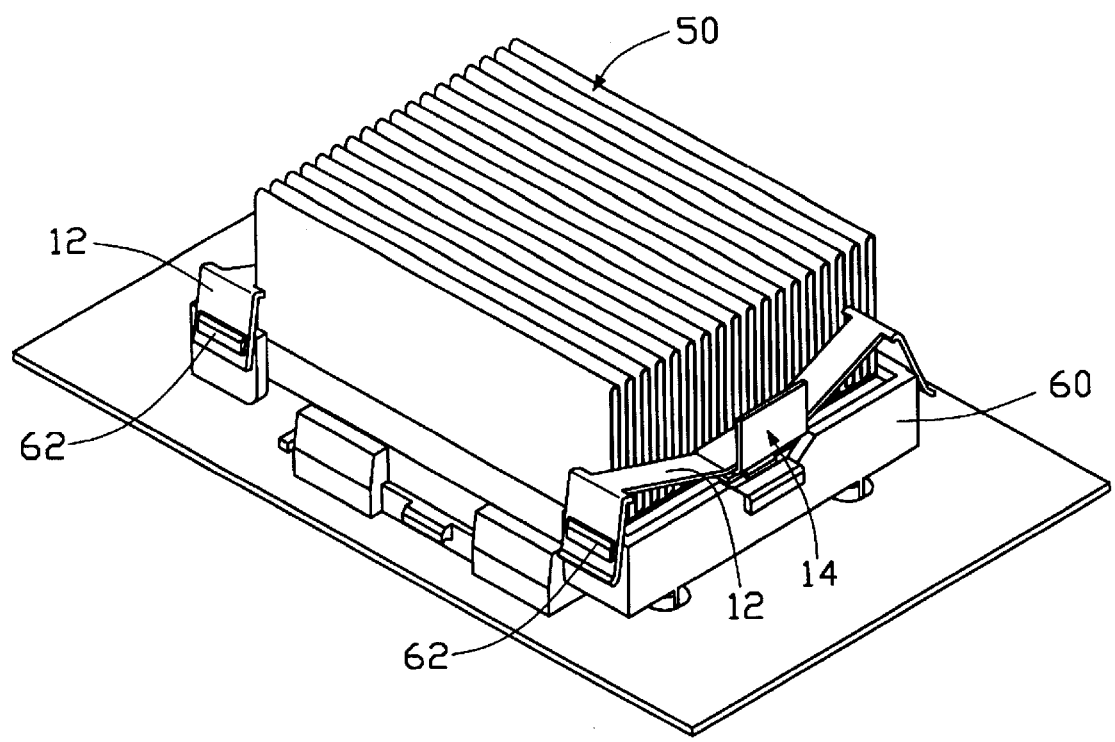
FIG. 6 is an assembled view of FIG. 5.

Referring to FIGS. 5 and 6, in assembly, a heat sink 50 is attached to an electronic device (not shown) by a pair of clips 10 fixed to a pair of retention modules 60 mounted on opposite sides of the electronic device. The apertures 30 of the clip bodies 12 engage with the corresponding catches 62 of retention modules 60. A recess 64 is defined in each retention module 60 for accommodating the fastener 14. The connecting portion 42 of each fastener 14 is inserted in the space between the horizontal section 26 and the guiding tabs 22. Each spring tab 46 extends through the recess 64 of the retention module 60 to be received in the gap 24 of the body 12. The spring tongue 21 of each horizontal section 26 is snapped into the slot 43 of the connecting portion 42 for preventing the fastener 14 from breaking away from the body 12. Each spring tab 46 is elastically deformed to press the heat sink 50. Simultaneously, each connecting portion 42 presses against the horizontal section 26 of the body 12 already fixed to the retention module 60. Thus, the heat sink 50 is attached to the electronic device.

In disassembly, the operation portion 40 of each fastener 14 is depressed downward and then pushed outward to disengage the spring tongue 21 of the horizontal section 26 from the slot 43 of the connecting portion 42, thereby detaching the fastener 14 from the body 12. The apertures 30 of the clip bodies 12 are then readily detached from the catches 62 of the retention module 60. Thus, the heat sink 50 is readily detached from the electronic device.

It is understood that the invention may be embodied in other forms without departing from the spirit thereof. Thus, the present example and embodiment are to be considered in all respects illustrative and not restrictive, and the invention is not to be limited to the details given herein.

What is claimed is:

1. A heat sink clip comprising:
   a body comprising a spring portion and two legs extending downwardly from two opposite ends of the spring portion and adapted to engage with a retention module, a spring tongue extending downwardly from the spring portion; and
   a fastener being inserted between the spring portion and a heat sink and releasably engaging with the spring portion, the fastener having an operation portion and a connecting portion forming a slot engaging with the spring tongue thereby preventing the fastener from breaking away from the spring portion of the body, a spring tab being integrally formed with and located under the connecting portion and accommodated between the spring portion and the heat sink for elastically pressing the heat sink toward the retention module.

2. The heat sink clip as described in claim 1, wherein the spring portion forms a horizontal section, and a pair of guiding tabs extends from an edge of the horizontal section and opposite an underside thereof, defining a space therebetween for insertion of the connecting portion of the fastener.

3. The heat sink clip as described in claim 2, wherein the guiding tabs are spaced from each other, defining a gap therebetween for receiving the spring tab therein.

4. A heat sink clip assembly comprising:
   a retention module;
   an electronic device positioned on the retention module;
   a heat sink positioned on the electronic device;
   a body comprising a spring portion and two legs at two opposite ends thereof, said legs latchably engaged with the retention module; and
   a fastener comprising a connecting portion detachably linearly attached to the spring portion, said fastener further including a spring tab continuously extending downwardly from an edge of the connecting portion of the fastener and being deformably accommodated in a space between the spring portion and the heat sink to abut against a top face of the heat sink.

5. The heat sink clip assembly as described in claim 4, wherein said fastener further includes an operation portion.

6. A method of assembling a heat sink with regard to an electronic device, comprising the steps of:
   providing a retention module;
   positioning an electronic device upon the retention module;
   positioning a heat sink upon the electronic device;
   providing a clip with a spring portion and two legs at two opposite ends thereof;
   providing a fastener with an integrally formed and downwardly extending spring tab;
   during assembling, loosely attaching the clip to the retention module with the legs being engaged with the retention module and with the heat sink being sandwiched between the spring portion and electronic device; and
   linearly inserting the fastener to a space between the spring portion of the clip and a top face of the heat sink, and having said spring tab abut against the top face of the heat sink.

7. The method as claimed in claim 6, further, during disassembling, including the steps of detaching the fastener from the clip, and then unlatching the legs from the retention module for freeing the heat sink therefrom.

* * * * *